(12) United States Patent
Kim

(10) Patent No.: US 7,666,480 B2
(45) Date of Patent: Feb. 23, 2010

(54) METHOD FOR FORMING PECVD SILICON NITRIDE FILM

(75) Inventor: Gwang Su Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 182 days.

(21) Appl. No.: 11/831,663

(22) Filed: Jul. 31, 2007

(65) Prior Publication Data

US 2008/0029021 A1    Feb. 7, 2008

(30) Foreign Application Priority Data

Aug. 1, 2006    (KR) .................. 10-2006-0072668

(51) Int. Cl.
*H05H 1/24*    (2006.01)

(52) U.S. Cl. ..................................... 427/569

(58) Field of Classification Search .................. 427/569
See application file for complete search history.

(56) References Cited

U.S. PATENT DOCUMENTS

| | | | | |
|---|---|---|---|---|
| 5,041,311 A | * | 8/1991 | Tsukune et al. | 427/579 |
| 2006/0121194 A1 | * | 6/2006 | Aiso | 427/248.1 |

\* cited by examiner

*Primary Examiner*—Timothy H Meeks
*Assistant Examiner*—Elizabeth Burkhart
(74) *Attorney, Agent, or Firm*—Workman Nydegger

(57) ABSTRACT

A method for forming a silicon nitride film in a PECVD batch type chamber is provided. In the PECVD silicon nitride film deposition method, as the number of batches of processed wafers increases, a silicon nitride deposition time is gradually adjusted to be longer as each batch of wafers is processed. Therefore a uniform thickness of the silicon nitride film is maintained despite variations in deposition rates resulting from an RF plasma cleaning process.

7 Claims, 4 Drawing Sheets

METHOD FOR FORMING PECVD SILICON NITRIDE FILM

CROSS-REFERENCE TO RELATED APPLICATION

This application claims priority to Korean Application No. 10-2006-0072668, filed on Aug. 1, 2006, which is incorporated herein by reference in its entirety.

BACKGROUND

1. Field of the Invention

The present invention relates to a dielectric film deposition method in the fabrication of semiconductor devices, and more particularly, to a method for forming a silicon nitride film in a plasma enhanced chemical vapor deposition (PECVD) batch type chamber.

2. Description of Related Art

Generally, PECVD equipment deposits a material formed by a chemical reaction in gas through electric discharge on a semiconductor substrate (i.e., a wafer) to form a dielectric film. In PECVD batch type equipment, deposition of layers or films of material is repeatedly performed on wafer batches. When a predetermined amount of film is deposited in a PECVD batch type equipment chamber, RF plasma cleaning is performed to remove film that has built up in the chamber. However, a temperature inside the chamber lowers after the RF plasma cleaning process, causing a decrease in deposition rate. This phenomenon occurs each time the RF plasma cleaning process is performed.

As a consequence of the decrease in deposition rate, the thickness of film deposited on the wafers is low before a first RF plasma cleaning process is performed and becomes abruptly high immediately after a second RF plasma cleaning process is performed. Therefore, due to differences in the deposition rates before and after the RF plasma cleaning process, thickness of films deposited on wafers may differ depending on when the batch of wafers underwent the deposition process (e.g., thick if immediately after an RF plasma cleaning process and thin if immediately before).

FIG. 1 is a flowchart illustrating a process of depositing silicon nitride films on wafers using a conventional PECVD batch type equipment.

Referring to FIG. 1, before silicon nitride film deposition occurs, pre-coating is performed by depositing a silicon oxide/nitride film in a chamber at step S100. Such silicon oxide/nitride film pre-coating prevents particle sources from being generated during the RF plasma cleaning and prevents the first wafer effect. The first wafer effect results in a different deposition rate for the first batch of wafers as compared to subsequent batches. For example, without silicon oxide/nitride film pre-coating, the inside of a chamber is not covered with a nitride film in a process for a first sheet or batch of wafers, but it is covered with a nitride film in a process for the next batch of wafers. This difference in conditions may cause a difference in deposition rates for each batch of wafers due to a difference of deposition rates on the inner surface of the chamber.

After pre-coating (s100), a batch of wafers on which a nitride film is to be deposited in a PECVD method is inserted into the chamber, and a PECVD silicon nitride film deposition process is performed at step S102. The deposition for each batch of wafers is performed for the same amount of time.

During the silicon nitride film deposition step, the silicon nitride film is formed on not only the wafers but also the inner surface of the chamber, a heater, and a shower head. Therefore, after the silicon nitride film deposition is performed on a predetermined number of wafers, the entry of a batch of wafers into the chamber is blocked, and an RF plasma cleaning process is performed at step S104. In the RF cleaning process, all the wafers are removed out of the chamber, and a cleaning gas such as HF, $SiF_4$, or Ar is injected to remove the silicon nitride film formed on the inner surface of the chamber, heater, and shower head. After the RF plasma cleaning process, a pump/purge process in the chamber is repeated several times to remove the remaining gas in a gas line and to remove impurities such as particles generated during the cleaning process, at step S106.

As described above, according to the process of depositing silicon nitride films on wafers of the related art, the thickness of the silicon nitride film is low before a first RF plasma cleaning process is performed and becomes abruptly high immediately after a second RF plasma cleaning process is performed. As this phenomenon occurs each time the RF plasma cleaning process is performed, the silicon nitride films differ in thickness from one batch of wafers to another due to the difference in the deposition rates before and after the RF plasma cleaning process. This effect is shown in FIG. 2 which shows a graph illustrating the thickness of the nitride films gradually decreasing after an RF plasma cleaning period.

The variation in film thickness may also cause a variation in capacitance values in metal insulator metal (MIM) nitride applications and a variation in Vt resistance values in pre-metal dielectric (PMD) linear film applications. These undesirable variations contribute to a reduction in overall manufacturing yield.

SUMMARY OF SOME EXAMPLE EMBODIMENTS

In general, example embodiments of the invention relate to forming a silicon nitride film in a PECVD chamber. In one example embodiment, a method for forming a silicon nitride film in a PECVD chamber can improve yield by maintaining a uniform thickness of silicon nitride films across different batches of processed wafers despite temperature variations introduced by an RF plasma cleaning process.

In accordance with one example embodiment of the present invention, a method for forming a silicon nitride film in a PECVD chamber includes pre-coating the PECVD chamber with a silicon nitride film to form a protection layer, inserting a wafer into the PECVD chamber to deposit a silicon nitride film on the wafer, and cleaning the PECVD chamber with RF plasma after depositing the silicon nitride film on a predetermined number of wafers. The time for depositing the silicon nitride film in the PECVD chamber is adjusted so as to deposit the silicon nitride film with a uniform thickness on each wafer.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Hereinafter, aspects of example embodiments of the present invention will be described in detail with reference to the accompanying drawings so that they can be readily implemented by those skilled in the art.

Figure 3:
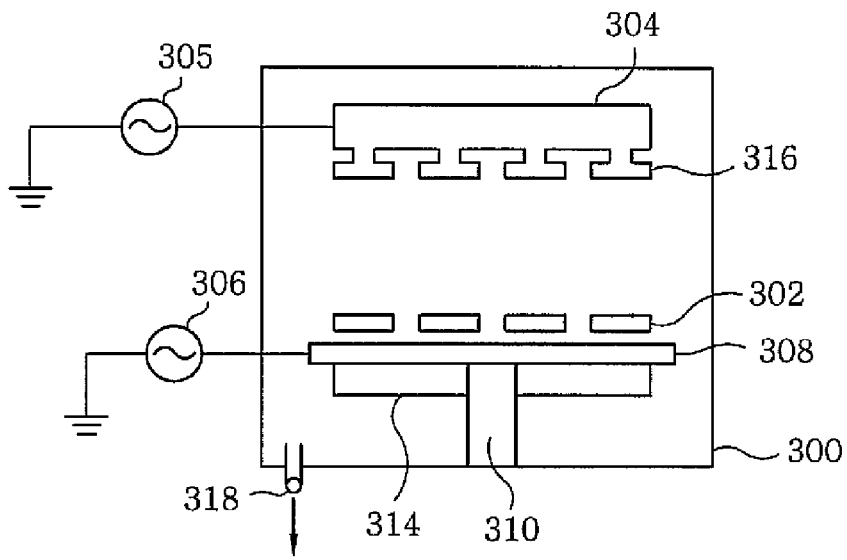
FIG. 3 is a schematic diagram illustrating a PECVD apparatus, to which an exemplary embodiment of the present invention may be applied.

FIG. 3 is a schematic diagram illustrating a PECVD apparatus to which an exemplary embodiment of the present invention may be applied. Referring to FIG. 3, the PECVD apparatus may include a chamber 300 in which thin films are deposited with reaction gas.

A first electrode 304 made of metal such as aluminum is placed at an upper portion of the chamber 300 to help gas injected into the chamber 300 to evenly spread onto a batch of substrates (i.e., wafers 302) and to transfer RF power. The first electrode 304 is connected to a first RF power generator 305.

A second electrode 308 made of metal such as aluminum is faced toward the first electrode 304 and placed at a lower portion of the chamber 300 to generate plasma. The second electrode 308 is connected to a second RF power generator 306.

A transferring unit 310 can move the second electrode 308 up and down. A heater 314 may be mounted under the second electrode 308 to heat the wafer 302. The heater may be a high-intensity lamp or resistive heater.

A shower head 316 and an exhaust pipe 318 may be equipped to inject and remove gas in the chamber 300. The shower head 316 may have a plurality of holes to inject gas into the chamber 300, and/or it may be integrated with the first electrode 304. The gas injected into the chamber 300 through the shower head 316 is well mixed and spread onto top surfaces of the wafer 302. Afterwards, remaining or newly formed gas may be exhausted to the outside through the exhaust pipe 318.

Figure 4:
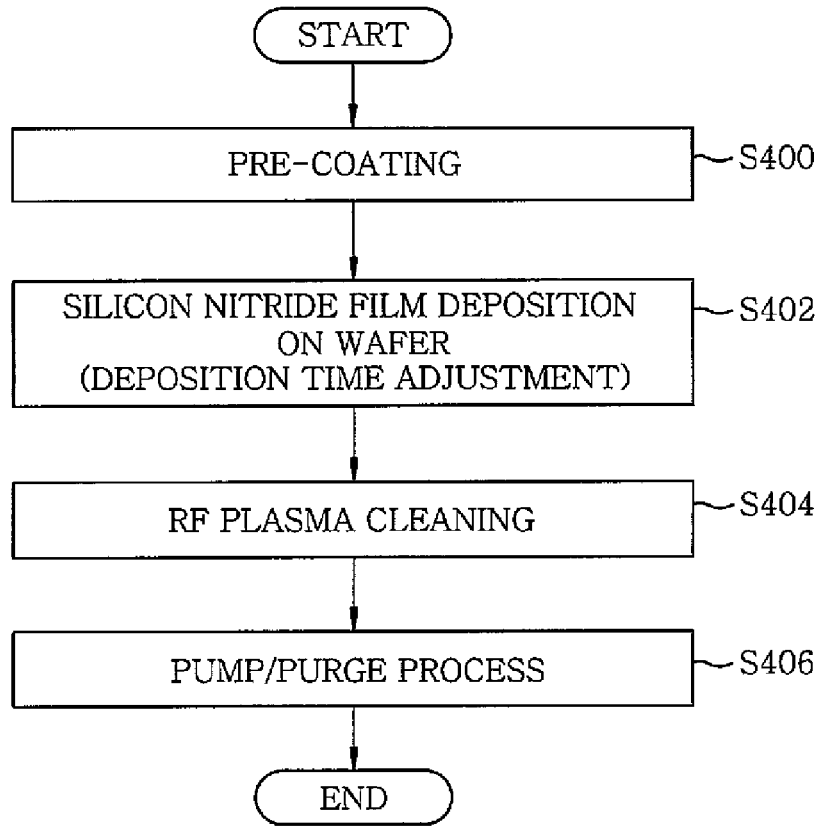
FIG. 4 is a flowchart illustrating a PECVD silicon nitride film forming process according to an exemplary embodiment.

FIG. 4 is a flowchart illustrating a process of depositing silicon nitride films on wafers in a PECVD apparatus according to an exemplary embodiment of the present invention. An exemplary embodiment will now be described in detail with reference to FIGS. 3 and 4.

First, before a wafer deposition process, pre-coating may be performed by depositing a silicon nitride film on the inner surface of the chamber 300 at step S400. Such silicon nitride film pre-coating prevents particle sources from being generated during the RF plasma cleaning and prevents the first wafer effect. (As discussed in the background section above, the first wafer effect may cause a difference in deposition rates for a first batch of wafers as compared to subsequent batches of wafers due to a difference of deposition rates on the inner surface of the chamber 300.)

Then, a batch of wafers 302 on which a silicon nitride film is to be deposited is inserted into the chamber 300, and a PECVD silicon nitride film deposition process is performed at step S402.

Figure 1:
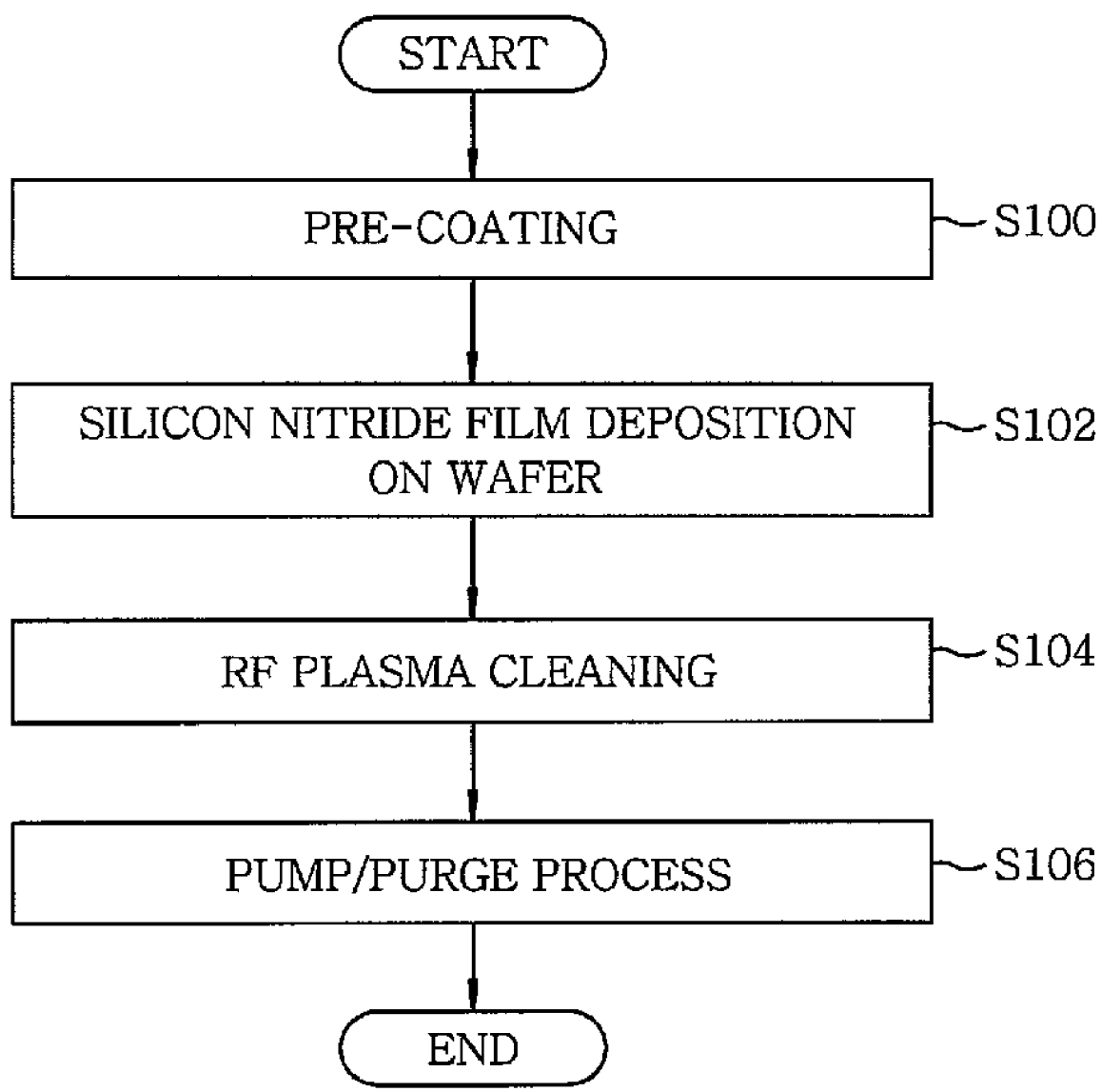
FIG. 1 is a flowchart illustrating a PECVD silicon nitride film forming process according to the related art.
Figure 2:
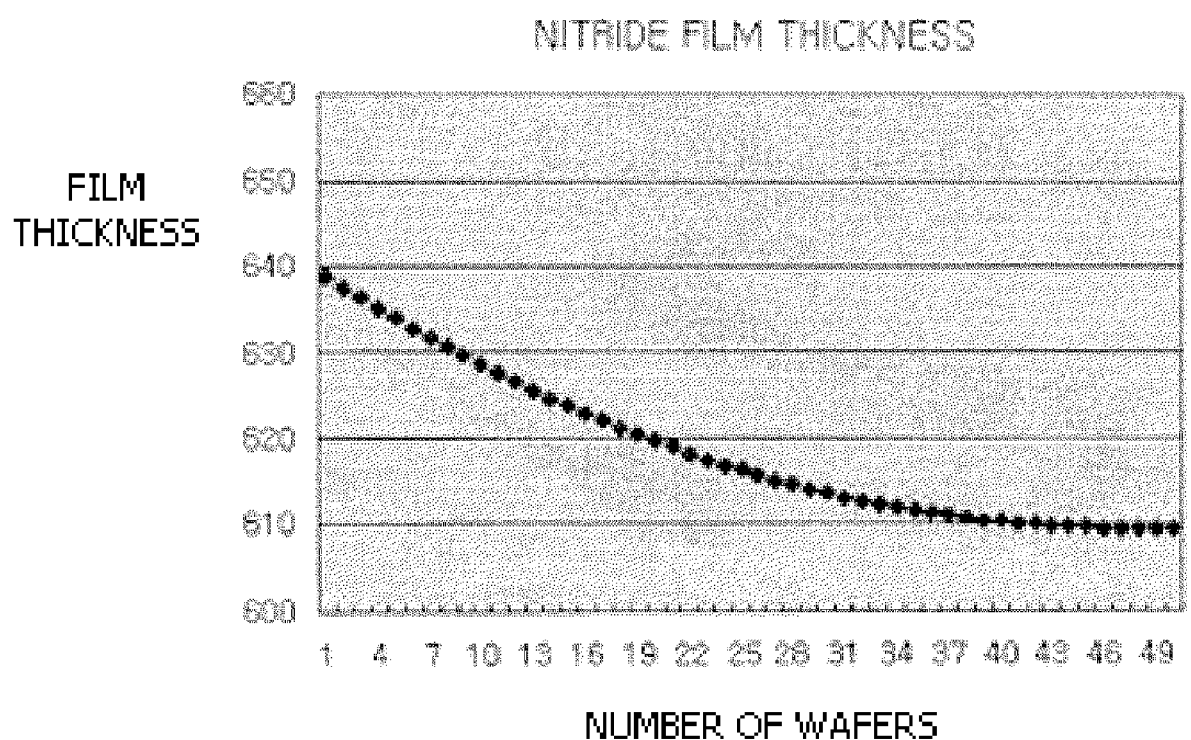
FIG. 2 is a graph illustrating the thickness of the nitride films on wafers according to a conventional PECVD process.

In the afore-mentioned PECVD silicon nitride film deposition process according to the related art, as the number of batches of wafers on which silicon nitride film deposition is performed increases, the silicon nitride films deposited on the wafers after the RF plasma cleaning process decrease in thickness, as shown in the graph of FIG. 2. Since the deposition process for each batch of wafers entered into the chamber 300 is performed for the same amount of time, the silicon nitride film on each batch of wafers may not be evenly formed in thickness.

Figure 5:
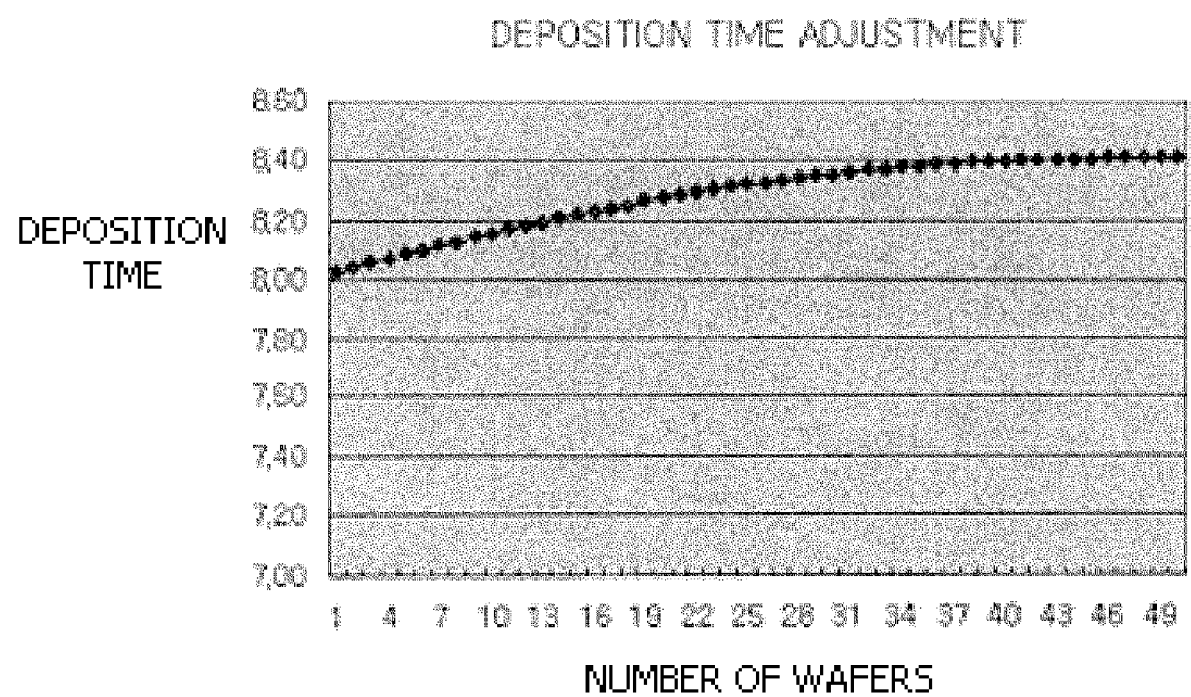
FIG. 5 is a graph illustrating an adjustment of silicon nitride film deposition time according to an exemplary embodiment.

According to the exemplary embodiment of the present invention, however, as the number of batches of processed wafers increases, the silicon nitride film deposition time is gradually adjusted to be longer as each batch of wafers is processed, as shown in FIG. 5. Such deposition time adjustment makes it possible to evenly deposit the silicon nitride films in a uniform thickness despite deposition rate variations resulting from the RF plasma cleaning process.

The silicon nitride deposition time is automatically adjusted to maintain the thickness of the silicon nitride film on each batch of wafers from the time of an initial wafer batch process occurring after a first RF plasma cleaning process to the time prior to a next RF plasma cleaning. The silicon nitride deposition time SDT may be calculated by the following Equation 1.

$$SDT = (10*T)/(bX^2 + cX + d) \quad \text{(Equation 1)}$$

In Equation 1, the variable X is an index that starts at 1 and is incremented for each calculation of SDT until a predetermined number of wafers (or batches of wafers) are processed, b is ranged from 0.0001 to 0.0003, c is ranged from −0.03 to −0.01, d is ranged from 5 to 15, and T is a standard deposition time per wafer. Herein, it is most preferable that b is 0.0002, c is −0.02 and d is 10.

Referring again to FIG. 4, during the silicon nitride film deposition process on each batch of wafers 302 in the chamber 300, the silicon nitride film is formed on not only the wafers but also the inner surface of the chamber 300, heater 314, and shower head 316. Therefore, after the silicon nitride film deposition is performed for a predetermined number of wafers, the entry of a wafer into the chamber is blocked, and an RF plasma cleaning process is performed at step S404.

In the cleaning process, all the wafers are removed out of the chamber, and a cleaning gas such as HF, SiF4, and Ar may be injected to remove the silicon nitride film formed on the inner surface of the chamber, heater 314, and shower head 316.

After the RF plasma cleaning process, a pump/purge process in the chamber may be repeated several times to remove the remaining gas in a gas line and impurities such as particles generated during the cleaning process, at step S406.

While the invention has been shown and described with respect to the preferred embodiments, it will be understood by those skilled in the art that various changes and modifications may be made without departing from the spirit and scope of the invention as defined in the following claims.

What is claimed is:

1. A method for forming a silicon nitride film on a wafer in a PECVD chamber, comprising:

pre-coating the PECVD chamber with a silicon nitride film to form a protection layer;

inserting a wafer into the PECVD chamber to deposit the silicon nitride film on the wafer;

adjusting a time for depositing the silicon nitride film in the PECVD chamber so as to deposit the silicon nitride film with a uniform thickness on each one of a predetermined number of wafers; and cleaning the PECVD chamber with RE plasma after depositing the silicon nitride film on the predetermined number of wafers, wherein, in the adjusting of the time for depositing the silicon nitride film, a deposition time SDT for each wafer is calculated by $SDT = (10*T)/(bX^2 + cX + d)$, wherein X is an index that is incremented for each calculation of SDT until the predetermined number of wafers are processed, T is a standard deposition time, and b, c, and d are constants.

2. The method for claim 1, wherein, in the adjusting of the time for depositing the silicon nitride film, the time is adjusted to be longer than a previously adjusted time.

3. The method for claim 1, wherein the constant b is ranged from about 0.0001 to about 0.0003.

4. The method for claim 1, wherein the constant c is ranged from about −0.03 to about −0.01.

5. The method for claim 1, wherein the constant d is ranged from about 5 to about 15.

6. A method for forming a silicon nitride film on a substrate in a chamber by a plasma enhanced chemical vapor deposition, comprising:

pre-coating the chamber with a silicon nitride film to form a protection layer;

transferring a substrate to be processed into the chamber;

depositing the silicon nitride film on the substrate to be processed for a deposition time, wherein the deposition time is adjusted such that a thickness of the silicon nitride film does not vary substantially on a plurality of processed substrates; and cleaning the chamber by using RE plasma after the depositing of the silicon nitride film is performed on a predetermined number of substrates, wherein the deposition time SDT for the wafer to be processed is calculated by $SDT = (10*T)/(bX^2 + cX + d)$, wherein X is an index that is incremented for each calculation of SDT until the predetermined number of substrates are processed, T is a standard deposition time, and b, c, and d are constants.

7. The method for claim 6, wherein the deposition time is adjusted to increase with respect to a previously adjusted deposition time.

\* \* \* \* \*